United States Patent [19]

Reeves et al.

[11] 4,010,415
[45] Mar. 1, 1977

[54] SWEEP GENERATOR FOR ENGINE ANALYZERS

[75] Inventors: George I. Reeves, Fullerton; Hoke R. Chism, Jr., Anaheim, both of Calif.

[73] Assignee: Beckman Instruments, Inc., Fullerton, Calif.

[22] Filed: Nov. 26, 1975

[21] Appl. No.: 635,741

[52] U.S. Cl. .............................. 324/16 S; 307/228; 328/185
[51] Int. Cl.² ....................................... G01R 29/00
[58] Field of Search ................ 324/16 S, 15, 16 R; 307/228; 328/185

[56] References Cited

UNITED STATES PATENTS

| | | | |
|---|---|---|---|
| 3,499,322 | 3/1970 | Pelta et al. | 324/16 R X |
| 3,577,007 | 5/1971 | Cross | 324/15 X |
| 3,603,879 | 9/1971 | Pelta et al. | 324/16 S |
| 3,617,869 | 11/1971 | Germann et al. | 324/15 |
| 3,638,107 | 1/1972 | Pelta et al. | 324/16 S |
| 3,714,499 | 6/1973 | Pelta et al. | 324/16 S X |
| 3,798,965 | 3/1974 | Pelta et al. | 324/16 S X |

*Primary Examiner*—Stanley T. Krawczewicz
*Attorney, Agent, or Firm*—R. J. Steinmeyer; P. R. Harder; D. A. Streck

[57] ABSTRACT

Method and apparatus for generating a sweep signal for the oscilloscope of an engine ignition analyzer, employing a lock loop with phase detector, integrator and voltage controlled oscillator. The oscillator provides a ramp voltage for use as a sweep signal. A feedback circuit provides a feedback signal to the input of the phase detector when the ramp voltage reaches a predetermined value for phase comparison with a reference signal related in time to an engine ignition event. The intetrator output controls the slope of the ramp voltage. When the two input signals to the phase detector are out of phase, the slope of the ramp voltage is changed via the integrator to reduce the phase difference. The ramp voltage provides a sweep signal of substantially constant length while the engine speed varies over the range of idling to full speed.

13 Claims, 3 Drawing Figures

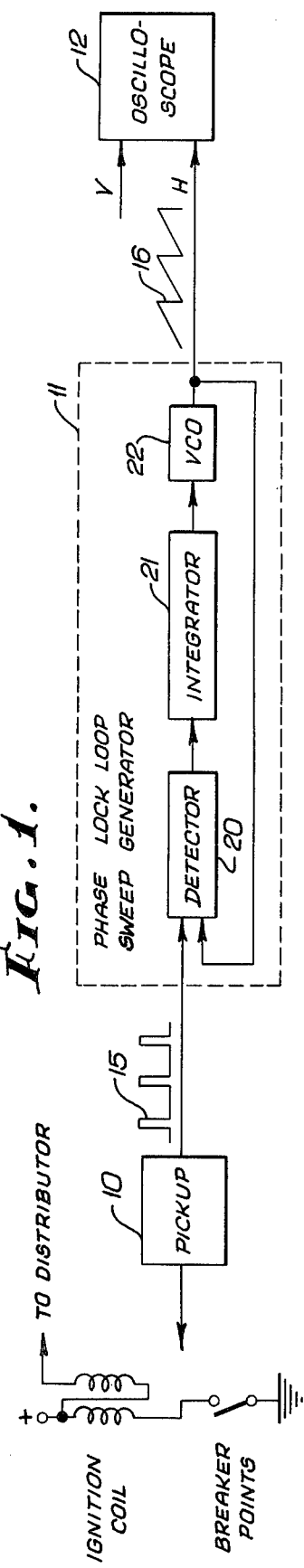
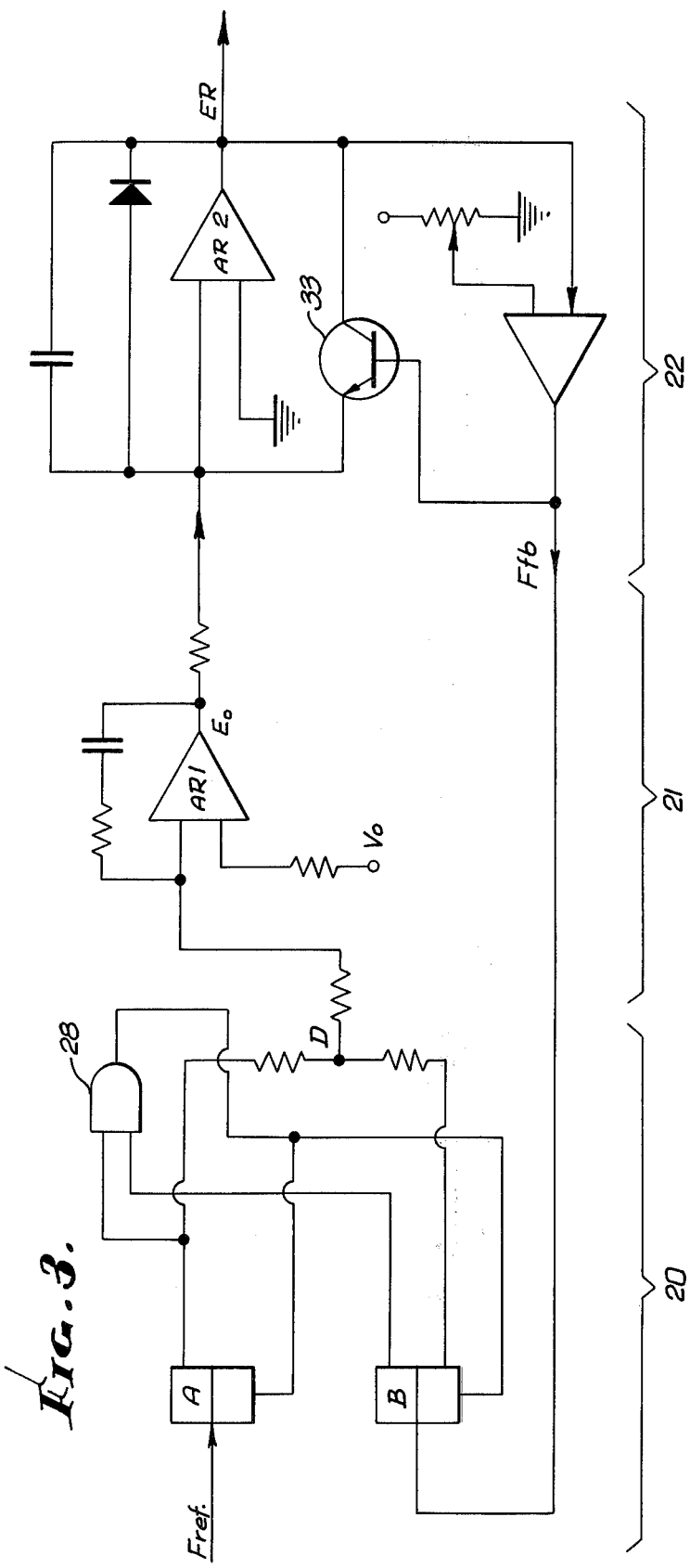

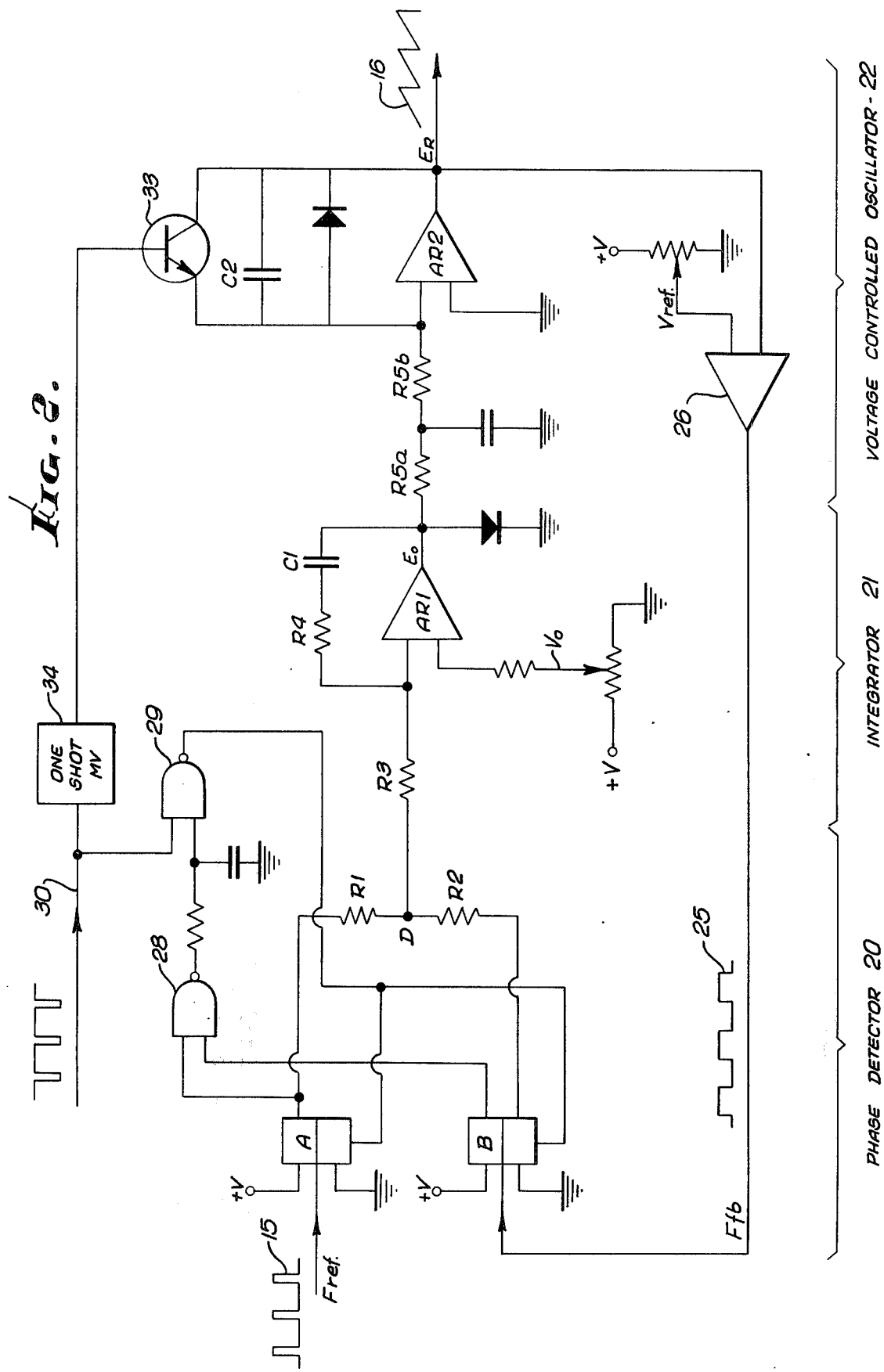

SWEEP GENERATOR FOR ENGINE ANALYZERS

BACKGROUND OF THE INVENTION

This invention relates to internal combustion engine ignition analyzers and in particular, to a new and improved method and apparatus for generating sweep signals for the oscilloscope of an analyzer.

Ignition analyzers are utilized at the present time by engine mechanics to provide information regarding the performance of an internal combustion engine, typically the engine for an automobile or truck. A cathode ray oscilloscope is provided for displaying certain types of information, usually with the horizontal sweeps being initiated by an ignition timing event such as points open or points closed or No. 1 plug firing or the like. The usual constant speed sweep is not satisfactory for engine analyzers where the engine speed will vary over a wide range between idling and full speed. It is desirable to have the horizontal sweep utilize the full width of the tube face regardless of sweep repetition rate, which is proportional to engine speed.

Prior art ignition analyzers have attempted to generate a horizontal sweep proportional to the engine speed and typically utilize amplitude comparison circuits. Various ways have been utilized in the past and each has had some limitation. The limitations on the prior art sweep generators usually show up as variation in the sweep length at different engine speeds. It is desirable to have the sweep generating system stable and therefore relatively large time constants are utilized; however, the large time constants tend to limit the ability of the system to synchronize itself with rapid changes in engine speed. Attempts have been made to speed up the synchronization by making the circuitry under damped; this results in a horizontal trace which at first is too long and then too short before settling down to the proper trace length.

It is an object of the present invention to provide a new and improved sweep generator for the oscilloscope of an engine ignition analyzer which provides a horizontal sweep of substantially constant length for a wide range of engine speeds. A particular object is to provide a phase lock loop for generating the ramp voltage for the sweep signal, making a phase comparison between the engine timing signal and the end of the sweep signal, with the slope of the ramp voltage being changed to reduce any difference in phase of the two signals so that the voltage at the end of the ramp (the end of the sweep) remains substantially constant regardless of the frequency of the input signals (the sweep repetition rate).

SUMMARY OF THE INVENTION

The method of the invention includes the steps of detecting the occurrence of an engine ignition event and providing a reference signal corresponding to the event, generating a ramp voltage for the sweep signal of the oscilloscope of an engine ignition analyzer, generating a feedback signal when the ramp voltage reaches a predetermined value, determining the difference in phase between the reference signal and the feedback signal and varying the slope of the ramp voltage in a direction to decrease this phase difference between the signals.

The apparatus of the invention comprises a sweep generator for the oscilloscope of an engine ignition analyzer including a pickup responsive to the engine ignition timing for generating a first electrical signal, a phase lock loop with phase detector, integrator, and voltage controlled oscillator, a comparator circuit having a reference voltage and the output of the oscillator as inputs and providing a feedback signal when the oscillator output reaches a predetermined value, with the first signal and the feedback signal connected to the phase detector as inputs. The phase detector output provides an input to the integrator which in turn provides an input to the oscillator, with the output of the oscillator being the desired ramp voltage.

BRIEF DESCRIPTION OF THE DRAWING

FIG. 1 is a block diagram showing an engine ignition analyzer incorporating the presently preferred embodiment of the invention;

FIG. 2 is an electrical schematic of the sweep generator of FIG. 1; and

FIG. 3 is a circuit similar to that of FIG. 2 showing an alternative embodiment of the sweep generator.

DESCRIPTION OF THE PREFERRED EMBODIMENTS

The ignition analyzer illustrated in FIG. 1 includes a pickup 10, a sweep generator 11 and an oscilloscope 12. The pickup provides an electrical output signal in the form of a train of pulses 15, which pulses are related in time to some event in the engine ignition system, such as points open or points closed or No. 1 plug firing or the like.

The pickup is coupled to some point in the ignition system by direct coupling or by inductive coupling or by capacitive coupling as desired, and the pickup may be of conventional design.

The sweep generator 11 provides the horizontal sweep signal for the trace of the oscilloscope 12 in the form of a cyclically repeating ramp voltage 16. The sweep signal is connected to the horizontal deflection plates of the oscilloscope in the conventional manner, and the signal to be displayed is connected to the vertical deflection plate.

The time interval between pulses 15 varies with the speed of the engine. The function of the sweep generator is to provide the ramp voltage 16 with a substantially constant peak value so that the sweep width is substantially the same regardless of the sweep rate or interval between sweep initiation signals (i.e., regardless of engine speed). This is accomplished by utilizing a phase lock loop in the sweep generator with the phase detector 20, integrator 21 and voltage control oscillator 22. The presently preferred embodiment for the sweep generator is shown in FIG. 2.

The phase detector 20 includes flip-flops A and B. The pulses 15 (designated $F_{ref}$) are connected as the input to flip-flop A. The input to flip-Flop B is another train of pulses 25 (designated $F_{fb}$). The pulses 25 are produced by a comparator 26 when the ramp voltage $E_r$ reaches a predetermined value, as determined by a reference voltage input $V_{ref}$ to the comparator 26.

In the system as illustrated, the flip-flop A is set by the positive going edge of a pulse 15 and the flip-flop B is set by the positive going edge of a pulse 25. The flip-flops are reset by a reset circuit including gates 28, 29 which provide the reset voltage when both flip-flops are set. The signal on line 30 is normally high and goes negative upon the occurrence of the engine ignition timing event with which the beginning of the ramp 16 is synchronized. Gate 29 acts as an OR gate and will reset flip-flops A and B either when both A and B are in the set state or upon the occurrence of the negative going portion of the signal on line 30. This later signal assures that both flip-flops A and B are in the normal or reset state at the beginning of the ramp and prevents the system from getting out of synchronization.

Resistors R1 and R2 are connected as a voltage divider with the junction D connected as the input to the integrator 21 through resistor R3. When flip-flop A is in the normal or reset state, resistor R1 is tied to a known voltage (in this case, 0). Similarly, when flip-flop B is in the normal state, resistor R2 is tied to a known voltage (designated as V). Amplifier AR1 of the integrator 21 has its reference input tied to voltage V which is set to be equal to the potential at the junction D when both flip-flops are in the reset state (in this example, V/2). Under this condition, there is no current through the resistor R3 and the integrator output E does not change. When only one of the flip-flops is set, the potential at D is greater than or less than the potential $V_0$ by a step function amoount V/2 producing a current in the resistor R3 and a change in the integrator output $E_0$ as will be hereinafter described in greater detail.

The amplifier AR2 of the voltage controlled oscillator 22 provides the output $E_r$ in the form of a ramp the slope of which is proportional to $E_o$. When the voltage $E_r$ reaches a value equal to $V_{ref}$, the pulse 25 is generated by the comparator 26. If the $F_{ref}$ pulse 15 occurs before the $F_{fb}$ pulse 25, flip-flop A is set and resistor R1 is connected to the voltage V causing point D to go from a potential of V/2 to V and the output $E_0$ to move in a negative direction. This causes the ramp $E_r$ to change slope and reach $V_{ref}$ sooner than it did in the preceding cycle. After the pulse 25 is generated, flip-flop B is set also and then both flip-flops are reset causing point D to assume a potential of V/2 and output $E_0$ to stabilize at its achieved value. If the $F_{ref}$ pulse occurs after the $F_{fb}$ pulse, the reverse operation occurs with point D going from a potential of V/2 to 0 and the output $E_0$ moving in a positive direction. This causes the ramp $E_r$ to reach $V_{ref}$ later than it did in the preceding cycle. With this pulsed compensation arrangement, the length of the horizontal sweep is controlled by $V_{ref}$ and is not subject to voltage or current feedback from a tachometer circuit or other variable related to engine speed.

The voltage controlled oscillator is reset to the initial condition by a switching transistor 33 connected across the output and input of amplifier AR2. The transistor 33 is actuated to the conducting condition by the negative going signal at 30 through a one shot multivibrator 34. In an alternative embodiment shown in FIG. 3, resetting is accomplished by using the signal $F_{fb}$ for controlling the switching transistor 33. The signal at 30 may be omitted entirely, with the flip-flops being reset by gate 28 when both flip-flops are in the set state.

The time duration of $t$ of the sweep is $$t = \frac{R_3 C_1 dv}{E_0}$$

where $dv$ the maximum voltage of the ramp (as determined by $V_{ref}$). The transfer function of the integrator is $$\frac{E_o}{E_{in}} = \frac{1 + j\omega\tau_2}{j\omega\tau_1}$$

where
$\tau_1 = [(R1 \text{ or } R2) + R3]C1$
$\tau_2 = R4\ C1$

The phase lock loop functions to reduce the phase difference between the inputs to the two flip-flops to a minimum and thereby maintain the maximum voltage of the ramp substantially constant so that the length of the sweep will be substantially constant and independent of the input pulse rates at the flip-flops (i.e., engine speed).

We claim:

1. An improved sweep generator for the oscilloscope of an engine ignition analyzer comprising:

a voltage controlled oscillator having an output and an input, said oscillator generating a ramp voltage at its output having a slope which is a function of the signal applied at its input;

means for connecting the output of said oscillator to the oscilloscope as the sweep signal;

a comparator circuit having a first reference voltage and said ramp voltage output of said oscillator as inputs and producing a feedback signal output when said inputs are equal;

an integrator having a pair of inputs and an output connected to said input of said oscillator whereby the output of said integrator will determine the slope of said ramp voltage output of said oscillator, one of said pair of inputs of said integrator being connected to a second reference voltage;

logic circuit means having a pair of inputs and an output, one of said inputs being connected to the output of said comparator circuit and the other of said inputs being connected to the ignition of an engine being analyzed, said logic circuit means producing an output equal to said second reference voltage when the signals at said pair of inputs are in coincidence, an output greater than said second reference voltage when the signal at one of said inputs is leading the signal at the other of said inputs and an output less than said second reference voltage when the signal at said one input is lagging the signal at said other input;

means connecting the output of said logic circuit means to the other of said pair of inputs of said integrator, and, resetting means connected to said input to said oscillator.

2. A sweep generator as defined in claim 1 wherein said logic circuit means includes a first flip-flop having said reference signal as the input, a second flip-flop having said feedback signal as the input, and a voltage divider connected to voltage sources by said flip-flops, with a point on said voltage divider being said output of said logic circuit means.

3. A sweep generator as defined in claim 2 including a reset circuit having flip-flop outputs as inputs for resetting both of said flip-flops when both are set.

4. A sweep generator as defined in claim 3 wherein said reset circuit includes a gate circuit having an engine timing pulse as an input for controlling flip-flop resetting.

5. A sweep generator as defined in claim 1 wherein said resetting means includes a switching circuit for interconnecting the input and output of said voltage controlled oscillator.

6. A sweep generator as defined in claim 5 including means for connecting said feedback signal to said switching circuit in controlling relation.

7. A sweep generator as defined in claim 5 including means for connecting an engine timing pulse to said switching circuit in controlling relation.

8. A sweep generator as defined in claim 3 wherein said means for resetting includes a switching circuit for interconnecting the input and output of said voltage controlled oscillator, with said switching and said reset circuit controlled by the same timing signal to reset said flip-flops and said oscillator at substantially the same time.

9. A sweep generator as defined in claim 8 wherein said timing signal is said feedback signal.

10. A sweep generator as defined in claim 8 wherein said timing signal is an engine timing pulse.

11. A method of generating a sweep signal of substantially constant length for the oscilloscope of an engine ignition analyzer while the sweep time varies as a function of engine speed, including the steps of:
  detecting the occurrence of an engine ignition event and providing a reference signal corresponding to such event;
  generating a ramp voltage for the sweep signal;
  generating a feedback signal when the ramp voltage reaches a predetermined value; and
  detecting the difference in phase between the reference signal and the feedback signal and when the signals are out of phase, varying the slope of the ramp voltage in a direction to decrease the phase difference between the signals.

12. The method as defined in claim 11 including resetting the ramp voltage to the initial value after the voltage reaches the predetermined value.

13. The method as defined in claim 11 including resetting the ramp voltage to the initial value on occurrence of an engine ignition event.

* * * * *